United States Patent
Hsiao et al.

(10) Patent No.: US 9,613,917 B2
(45) Date of Patent: Apr. 4, 2017

(54) PACKAGE-ON-PACKAGE (POP) DEVICE WITH INTEGRATED PASSIVE DEVICE IN A VIA

(75) Inventors: Ching-Wen Hsiao, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/435,809

(22) Filed: Mar. 30, 2012

(65) Prior Publication Data
US 2013/0256836 A1 Oct. 3, 2013

(51) Int. Cl.
*H01L 23/52* (2006.01)
*H01L 21/768* (2006.01)
(Continued)

(52) U.S. Cl.
CPC .......... *H01L 23/642* (2013.01); *H01L 21/486* (2013.01); *H01L 23/147* (2013.01); *H01L 23/49822* (2013.01); *H01L 23/49827* (2013.01); *H01L 23/5389* (2013.01); *H01L 25/105* (2013.01); *H01L 23/49816* (2013.01); *H01L 28/20* (2013.01); *H01L 28/90* (2013.01); *H01L 2224/16227* (2013.01); *H01L 2224/16235* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06565* (2013.01); *H01L 2225/1023* (2013.01); *H01L 2225/1041* (2013.01); *H01L 2225/1058* (2013.01); *H01L 2924/15311* (2013.01);
(Continued)

(58) Field of Classification Search
CPC ......... H01L 21/10; H01L 27/08; H01L 27/02; H01L 23/642; H01L 25/105; H01L 23/147; H01L 21/486; H01L 28/40; H01L 27/0805; H01L 27/0794; H01L 27/0755; H01L 27/0676
USPC ........................................................ 257/532
See application file for complete search history.

(56) References Cited

U.S. PATENT DOCUMENTS 6,281,046 B1  8/2001  Lam
6,335,565 B1  1/2002  Miyamoto et al.
(Continued)

FOREIGN PATENT DOCUMENTS

CN  102034718 A  4/2011
CN  102157391 A  8/2011
(Continued)

OTHER PUBLICATIONS

Zhang, et al., "Lead-Free Bumping and Its Challenges," IWPLC Conference Proceedings, Oct. 10, 2004, 8 pg.
(Continued)

*Primary Examiner* — Thomas L Dickey
*Assistant Examiner* — Damon Hillman
(74) *Attorney, Agent, or Firm* — Slater Matsil, LLP

(57) ABSTRACT

A package for a use in a package-on-package (PoP) device. The package includes a substrate, a polymer layer formed on the substrate, a first via formed in the polymer layer, and a material disposed in the first via to form a first passive device. The material may be a high dielectric constant dielectric material in order to form a capacitor or a resistive material to form a resistor.

20 Claims, 4 Drawing Sheets

(51) Int. Cl.
  *H01L 21/50* (2006.01)
  *H01L 23/64* (2006.01)
  *H01L 23/538* (2006.01)
  *H01L 23/14* (2006.01)
  *H01L 21/48* (2006.01)
  *H01L 25/10* (2006.01)
  H01L 49/02 (2006.01)
  H01L 23/498 (2006.01)

(52) U.S. Cl.
  CPC ............... *H01L 2924/19041* (2013.01); *H01L 2924/19105* (2013.01)

(56) References Cited

U.S. PATENT DOCUMENTS

| | | | |
|---|---|---|---|
| 7,105,920 | B2 | 9/2006 | Su et al. |
| 8,093,722 | B2 | 1/2012 | Chen |
| 8,105,875 | B1 | 1/2012 | Hu et al. |
| 8,143,097 | B2 | 3/2012 | Chi et al. |
| 8,263,439 | B2 | 9/2012 | Marimuthu et al. |
| 8,293,580 | B2 | 10/2012 | Kim et al. |
| 8,361,842 | B2 | 1/2013 | Yu et al. |
| 8,476,769 | B2 | 7/2013 | Chen et al. |
| 8,503,186 | B2* | 8/2013 | Lin ............... H01L 21/76898 257/433 |
| 8,508,045 | B2 | 8/2013 | Khan et al. |
| 8,604,568 | B2 | 12/2013 | Stacey |
| 8,736,035 | B2 | 5/2014 | Hwang et al. |
| 8,754,514 | B2 | 6/2014 | Yu et al. |
| 8,791,016 | B2 | 7/2014 | Gambino et al. |
| 8,928,114 | B2 | 1/2015 | Chen et al. |
| 8,975,726 | B2 | 3/2015 | Chen et al. |
| 9,048,306 | B2 | 6/2015 | Chi et al. |
| 2002/0117743 | A1 | 8/2002 | Nakatani et al. |
| 2004/0187297 | A1* | 9/2004 | Su ............... H01C 17/065 29/620 |
| 2004/0256731 | A1 | 12/2004 | Mao et al. |
| 2006/0043549 | A1 | 3/2006 | Hsu |
| 2006/0133056 | A1* | 6/2006 | Wyrzykowska ....... H05K 1/023 361/763 |
| 2007/0161266 | A1 | 7/2007 | Nishizawa |
| 2008/0006936 | A1 | 1/2008 | Hsu |
| 2008/0142976 | A1 | 6/2008 | Kawano |
| 2008/0220563 | A1 | 9/2008 | Karnezos |
| 2008/0277800 | A1 | 11/2008 | Hwang et al. |
| 2009/0057862 | A1 | 3/2009 | Ha et al. |
| 2009/0155957 | A1 | 6/2009 | Chen et al. |
| 2009/0230535 | A1 | 9/2009 | Otremba et al. |
| 2010/0112756 | A1 | 5/2010 | Amrine et al. |
| 2010/0127345 | A1 | 5/2010 | Sanders et al. |
| 2010/0133704 | A1 | 6/2010 | Marimuthu et al. |
| 2010/0140779 | A1 | 6/2010 | Lin et al. |
| 2010/0155126 | A1* | 6/2010 | Kunimoto ............ H01L 21/568 174/260 |
| 2010/0155922 | A1 | 6/2010 | Pagaila et al. |
| 2010/0237482 | A1 | 9/2010 | Yang et al. |
| 2011/0024902 | A1 | 2/2011 | Lin et al. |
| 2011/0024916 | A1 | 2/2011 | Marimuthu et al. |
| 2011/0037157 | A1 | 2/2011 | Shin et al. |
| 2011/0062592 | A1 | 3/2011 | Lee et al. |
| 2011/0090570 | A1 | 4/2011 | DeCusatis et al. |
| 2011/0156247 | A1 | 6/2011 | Chen et al. |
| 2011/0163391 | A1 | 7/2011 | Kinzer et al. |
| 2011/0186960 | A1 | 8/2011 | Wu et al. |
| 2011/0186977 | A1 | 8/2011 | Chi et al. |
| 2011/0215464 | A1 | 9/2011 | Guzek et al. |
| 2011/0241218 | A1 | 10/2011 | Meyer et al. |
| 2011/0260336 | A1 | 10/2011 | Kang et al. |
| 2012/0038053 | A1* | 2/2012 | Oh ............... H05K 1/186 257/773 |
| 2012/0049346 | A1 | 3/2012 | Lin et al. |
| 2012/0139068 | A1 | 6/2012 | Stacey |
| 2012/0139295 | A1 | 6/2012 | Huepperling |
| 2012/0161315 | A1 | 6/2012 | Lin |
| 2012/0208319 | A1 | 8/2012 | Meyer |
| 2012/0319294 | A1 | 12/2012 | Lee et al. |
| 2012/0319295 | A1 | 12/2012 | Chi et al. |
| 2013/0009322 | A1 | 1/2013 | Conn et al. |
| 2013/0009325 | A1 | 1/2013 | Mori et al. |
| 2013/0062760 | A1 | 3/2013 | Hung et al. |
| 2013/0062761 | A1 | 3/2013 | Lin et al. |
| 2013/0093078 | A1 | 4/2013 | Lin et al. |
| 2013/0105991 | A1 | 5/2013 | Gan et al. |
| 2013/0111123 | A1 | 5/2013 | Thayer |
| 2013/0182402 | A1 | 7/2013 | Chen et al. |
| 2013/0234322 | A1 | 9/2013 | Pendse |
| 2013/0334697 | A1 | 12/2013 | Shin et al. |
| 2014/0091473 | A1 | 4/2014 | Len et al. |
| 2014/0110856 | A1 | 4/2014 | Lin |
| 2014/0264836 | A1 | 9/2014 | Chun et al. |
| 2015/0093881 | A1 | 4/2015 | Chen et al. |
| 2015/0115464 | A1 | 4/2015 | Yu et al. |
| 2015/0115470 | A1 | 4/2015 | Su et al. |

FOREIGN PATENT DOCUMENTS

| | | |
|---|---|---|
| KR | 101099578 B1 | 12/2011 |
| KR | 1020120075855 | 7/2012 |
| KR | 1020120094182 | 8/2012 |
| KR | 1020120098844 | 9/2012 |
| TW | 200919632 | 5/2009 |
| TW | 201230266 A | 7/2012 |
| WO | 2011090570 | 7/2011 |

OTHER PUBLICATIONS

Cheah, Bok Eng, et al., "A Novel Inter-Package Connection for Advanced Package-on-Package Enabling," IEEE Electronic Components and Technology Conference, May 31, 2011-Jun. 3, 2011, pp. 589-594.

* cited by examiner

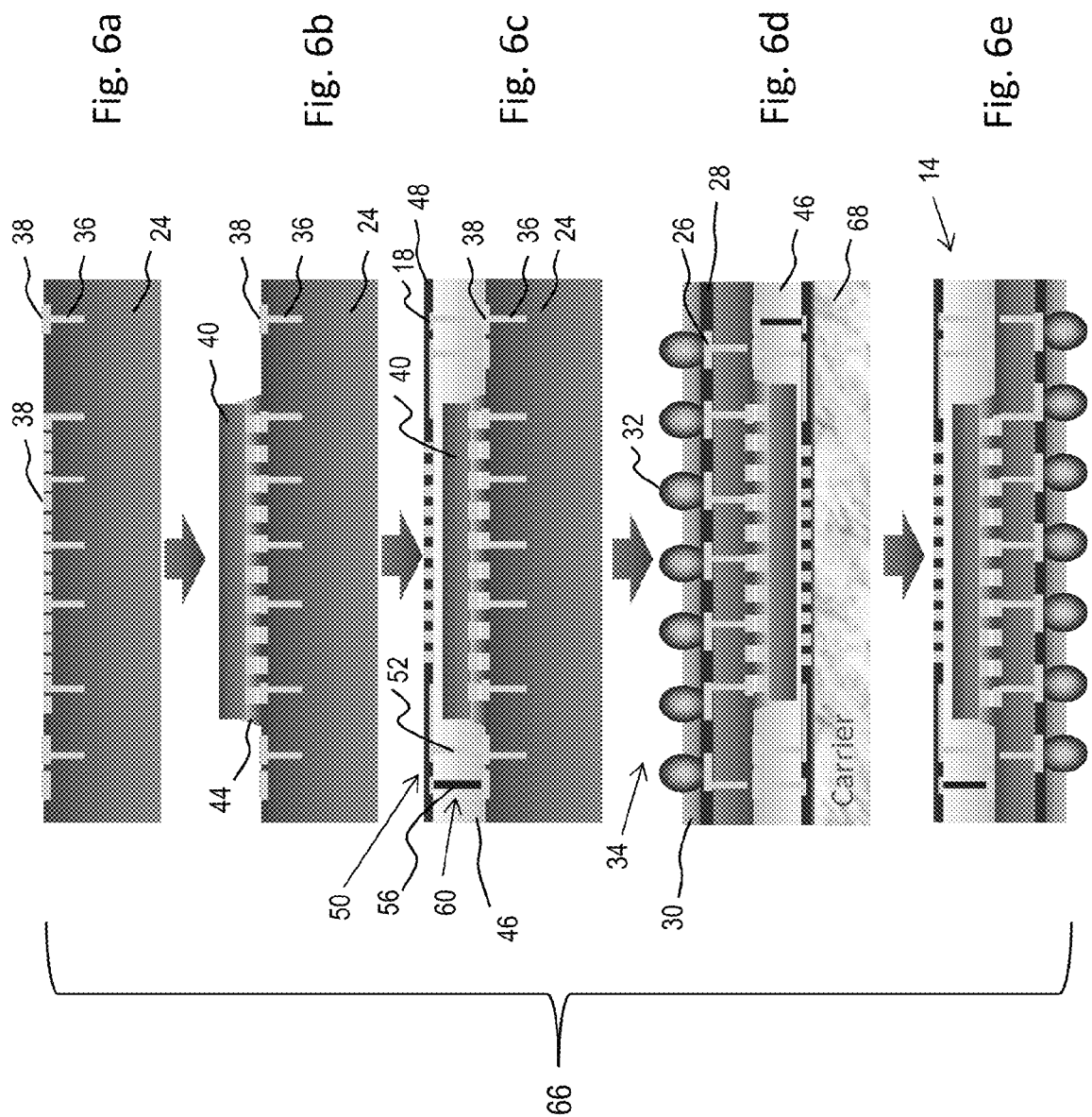

PACKAGE-ON-PACKAGE (POP) DEVICE WITH INTEGRATED PASSIVE DEVICE IN A VIA

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic ball grid array (BGA) packages. In PoP package designs, the top package may be interconnected to the bottom package through peripheral solder balls.

Another packaging technique that has been developed is Fan-in Package-on-Package (FiPoP). A Fi-PoP device may incorporate multiple logic, analog, and memory devices in the bottom package. The Fi-PoP device structure permits smaller top packages (e.g., memory packages) to be mounted to the bottom package using center ball grid array patterns on the top package.

Because of the desire to continually reduce the size and height of PoP devices, the available space between the top and bottom packages is extremely limited.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 6a-6e collectively illustrate an embodiment of a process of forming the FiPoP device of FIG. 1.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a Fan-in Package-on-Package (FiPoP) semiconductor device. The concepts in the disclosure may also apply, however, to other semiconductor structures or circuits.

Figure 1:
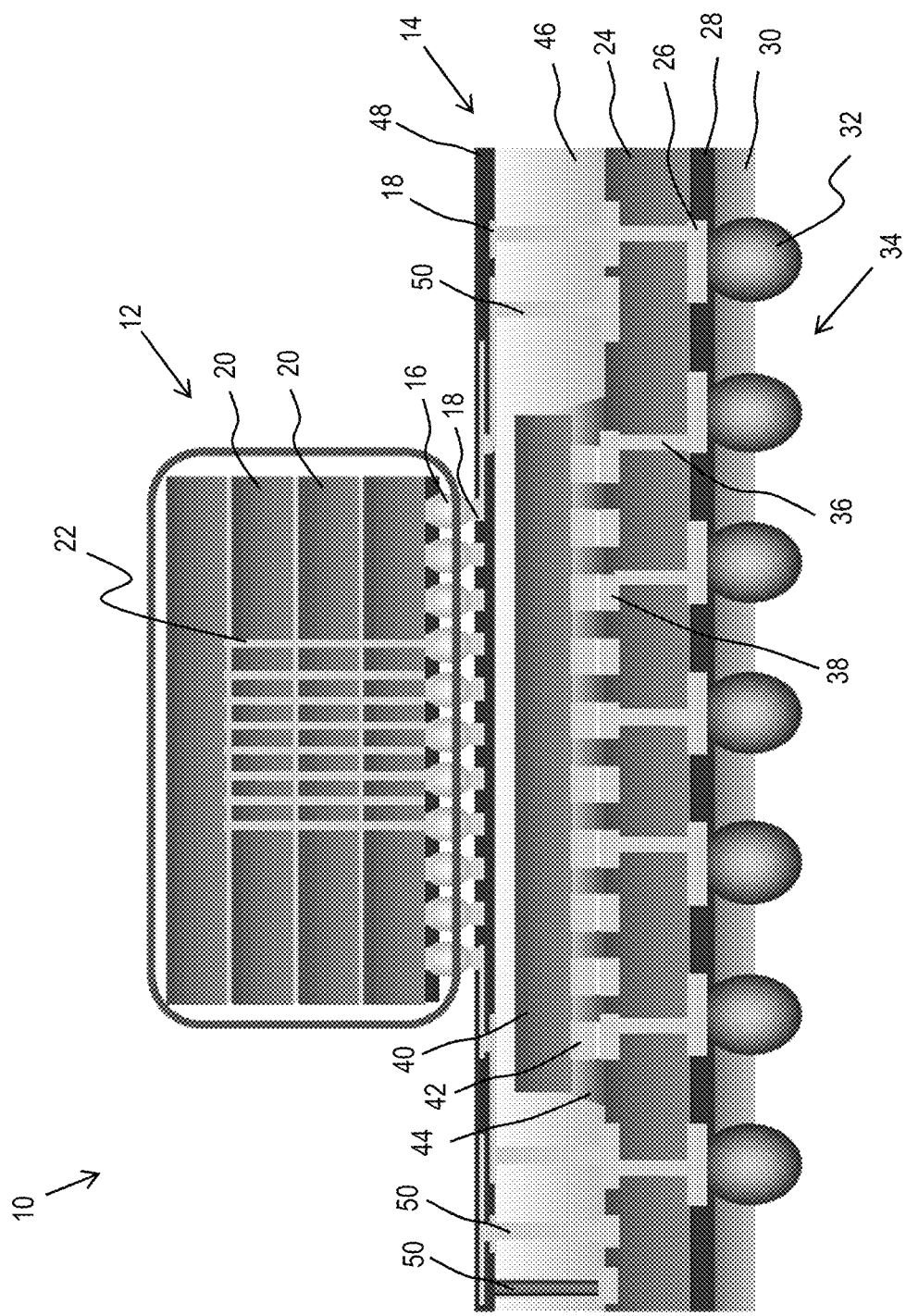
FIG. 1 is a cross section of an embodiment of a fan-in package-on-package (FiPoP) device.

Referring concurrently to FIG. 1, an embodiment FiPoP device 10 is illustrated. As will be more fully explained below, the FiPoP device 10 provides an innovative package-on-package structure with integrated, or built-in, passive devices. As such, the FiPoP device 10 offers improved electrical performance and a higher operation frequency relative to a conventional FiPoP device or a standard Package-on-Package (PoP) device. As shown in FIG. 1, the FiPoP device 10 generally includes a top package 12 coupled to a bottom package 14 through a center ball grid array 16 and corresponding contacts 18.

In an embodiment, the top package 12 includes several stacked memory chips 20. The memory chips 20 may be electrically coupled to each other through, for example, wire bonds 22. While several memory chips 20 are depicted in FIG. 1, in an embodiment the top package 12 may include a single memory chip 20. The top package 12 may also incorporate other chips, dies, or electronic circuitry depending on the intended use or performance needs of the FiPoP device 10.

The bottom package 14 includes a substrate 24 formed from a suitable semiconductor material (e.g., silicon, etc.). The substrate 24 generally includes and supports an under bump metallization (UBM) 26, a first passivation layer 28, and a molding layer 30. The UMB 26 is configured to engage with solder balls 32 from a ball grid array (BGA) 34. The BGA 34 may be employed to mount the FiPoP device 10 to, for example, a circuit board or another electronic device.

The first passivation layer 28 generally protects the substrate 22 and encapsulates the UBM 26. The first passivation layer 28 may be formed from, for example, a passivating oxide, silicon nitride (SiN), silicon nitrogen oxide (SiNOx), or silicon oxide (SiOx). Other layers, such as a polymeric layer formed from polybenzoxaxole, may be used in addition to, or instead of, the first passivation layer 28. The molding layer 30 overlies the first passivation layer 28 and is disposed adjacent to the solder balls 32. The molding layer 30 may be formed from a variety of suitable molding compounds.

Still referring to FIG. 1, the bottom package 14 includes numerous metal interconnections 36 formed through the substrate 24. The metal interconnections 36 extend between, and electrically couple, the UBM 26 to contacts 38 embedded in or supported by an upper portion of the substrate 24. In an embodiment, the contacts 38 are used to mount a die 40 (e.g., a logic integrated circuit, an analog device, etc.) to the substrate 24. In an embodiment, the die 40 (i.e., a chip) is mounted on the substrate 24 (e.g., a semiconductor wafer) using solder connections 42 formed during a chip-on-wafer (CoW) bonding process. As shown in FIG. 1, an underfill material 44 may be flowed between the die 40 and the substrate 24 in order to encapsulate the solder connections 42.

The bottom package 14 also includes a lamination layer 46 disposed on the substrate 24. The lamination layer 46 generally encapsulates the die 40 and may be formed from a polymer (e.g., an organic polyimide, lead oxide, an epoxy, etc.) or a photodielectric. As shown in FIG. 1, the lamination layer 46 also supports a second passivation layer 48.

The second passivation layer 48 may be formed from a passivating oxide, silicon nitride (SiN), silicon nitrogen oxide (SiNOx), or silicon oxide (SiOx). Other layers, such as a polymeric layer formed from polybenzoxaxole, may be used in addition to, or instead of, the second passivation layer 48. Still referring to FIG. 1, additional contacts 18 are disposed within the second passivation layer 48. As noted above, some of the contacts 18 are employed to mount the top package 12. Some of the other contacts 18 embedded or supported by the second passivation layer 48 are formed over vias 50 that have been formed in the lamination layer 46.

Figure 2:
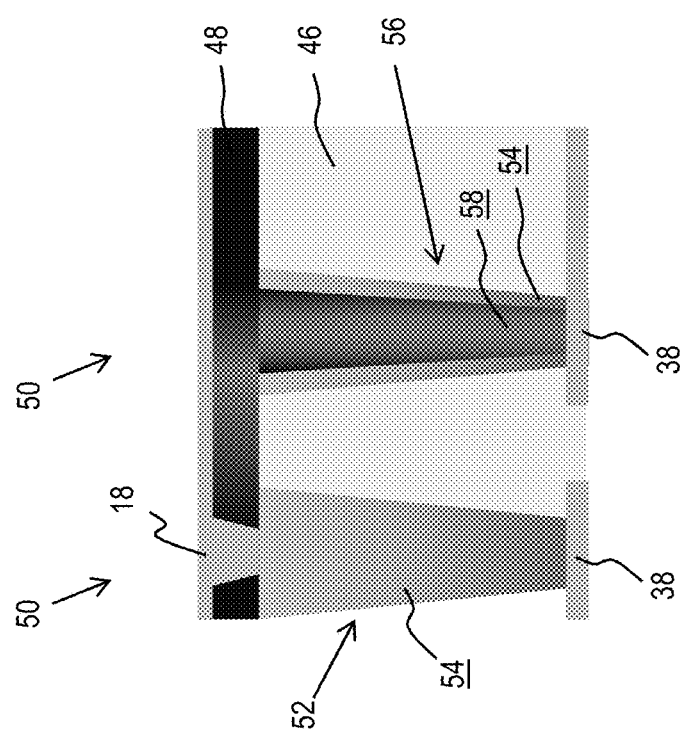
FIG. 2 is a representative portion of the FiPoP device of FIG. 1 highlighting two of the vias in the FiPoP device.

Referring now to FIG. 2, which represents and highlights a portion of the PoP device 10 of FIG. 1, two of the vias 50 are illustrated in greater detail. As shown in FIG. 2, a first via 52 has been plated with metal 54. As such, the first via 52 forms an electrical interconnection between one of the contacts 18 embedded in the second passivation layer 48 and one of contacts 38 embedded in the substrate 24 (FIG. 1). In an embodiment, the first via 52 is plated with copper or another highly conductive metal.

Still referring to FIG. 2, a second via 56 is plated with metal 54 and then filled with a dielectric material 58. In an embodiment, the dielectric material 58 is a material with a high dielectric constant compared to silicon dioxide ($SiO_2$) such as, for example, hafnium silicate ($HfSiO_4$), zirconium silicate ($ZrSiO_4$), hafnium dioxide ($HfO_2$), zirconium dioxide ($ZrO_2$), yttrium oxide ($Y_2O_3$), aluminum oxide ($Al_2O_3$), and the like. Other dielectric materials may also be used in other embodiments.

Figure 3:
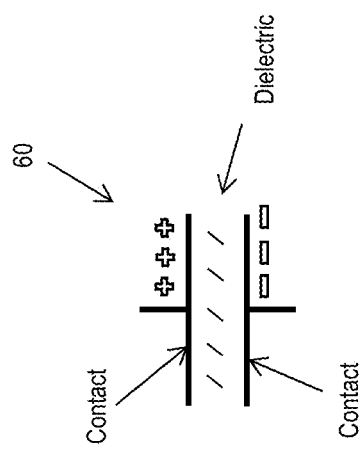
FIG. 3 is a simplified circuit model for a capacitor formed in one of the vias of FIG. 2.

As shown in FIG. 2, a top surface of the dielectric material 58 in the second via 56 engages or encounters a non-conducting material such as, for example, the second passivation layer 48 disposed under the contact 18. In contrast, a bottom surface of the dielectric material 58 in the second via 56 engages one of contacts 38 embedded in the substrate 24. In this configuration, the second via 56 forms a high volume capacitor 60 as shown in FIG. 3. Referring collectively to FIGS. 2 and 3, the contact 18 generally forms the top plate or contact while the contact 38 and the metal 54 plated sidewalls of the via 56 form the bottom plate or contact of the capacitor 60.

In an embodiment, several the second vias 56 in the bottom package 14 are filled with the dielectric material 58 to form a plurality of capacitors 60 depicted in FIG. 3. In an embodiment, one or more of the capacitors 60 in the plurality are electrically coupled together. In an embodiment, the capacitors 60 in the plurality may be directly horizontally adjacent to one another. In an embodiment, the capacitors 60 may be spaced apart from each other by one or more of the first vias 52 functioning as an interconnect. In an embodiment, some of the second vias 56 are filled with a different dielectric material 58 relative to other second vias 56. Therefore, one of the capacitors 60 in the bottom package 14 may provide a different capacitance relative to another of the capacitors 60 in the bottom package.

Figure 5:
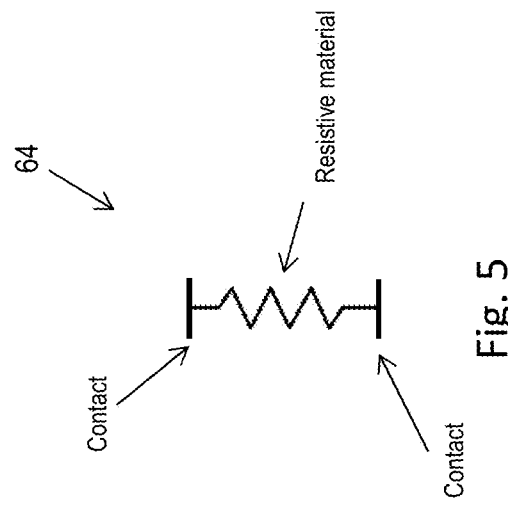
FIG. 5 is a simplified circuit model for a resistor formed in one of the vias of FIG. 4.
Figure 4:
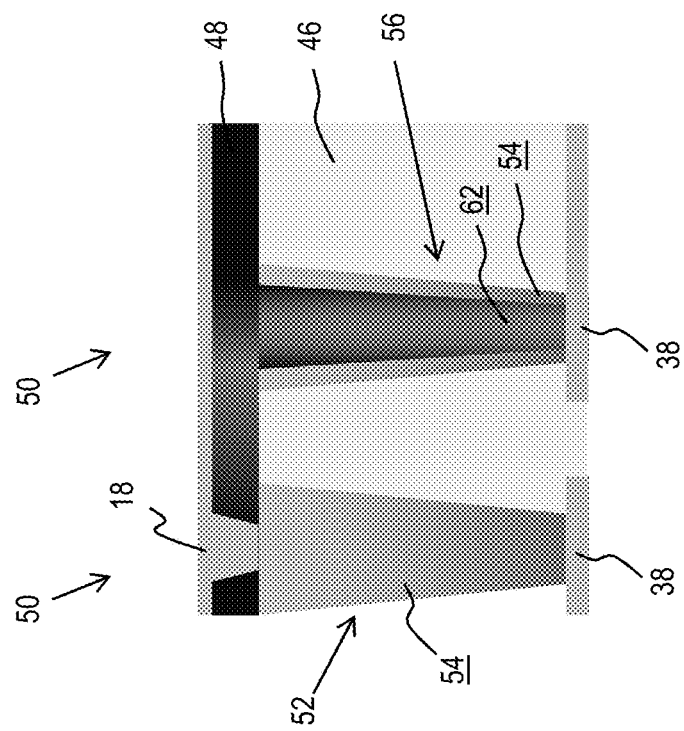
FIG. 4 is a representative portion of an embodiment of another FiPoP device highlighting two of the vias in the FiPoP device.

Referring collectively to FIGS. 4-5, in an embodiment the second vias 56 in the bottom package 14 of the PoP device 10 are filled with a resistive material 62 (instead of a dielectric material 58) in order to form a resistor 64. In an embodiment, the resistive material 62 may be formed from carbon, a carbon composition, a ceramic, a metal oxide (e.g., tin oxide), and the like. In an embodiment, some of the second vias 56 are filled with a different resistive material 62 relative to other second vias 56. Therefore, one of the resistors 64 in the bottom package 14 may provide a different resistance relative to another capacitor 64 in the bottom package.

Referring collectively to FIGS. 6a-6e, an embodiment of a process 66 for forming the FiPoP device 10 of FIG. 1 is sequentially illustrated. As shown in FIG. 6a, the substrate 24 (e.g., a silicon wafer) is subjected to a through silicon via (TSV) process to generate vias in the substrate 24. Once the vias have been formed, an electroplating process is initiated to plate the vias with, for example, copper. These copper-plated vias form the interconnections 36 in the substrate 24. After the vias in the substrate 24 have been plated, a back end of line (BEOL) scheme is implemented to electrically connect the copper-plated vias and to form the contacts 38. The copper-plated vias may be used to interconnect components of the top package 12 and components of the bottom package 14 (FIG. 1). Thereafter, in an embodiment a testing process is performed to ensure that the circuits formed by BEOL scheme are acceptable.

Moving now to FIG. 6b, the die 40 (e.g., a memory chip) is coupled to the substrate 24 through a chip-on-wafer (CoW) bonding process. In an embodiment, the chip 40 is coupled to the substrate 24 using a flip-chip bumping or other chip bonding process. Thereafter, the underfill 44 material is flowed or otherwise introduced in between the die 40 and the substrate 24.

Next, as shown in FIG. 6c, a lamination process is performed to generate a lamination layer 46 over the chip 40 and a top surface of the substrate 24 adjacent to the chip 40. In an embodiment, the lamination layer 46 is formed from a dielectric material such as a polymer (e.g., an organic polyimide, an epoxy, etc.), lead oxide, or a photodielectric. In an embodiment, the lamination layer 46 completely encapsulates the die 40.

Thereafter, the vias 50 are formed through the lamination layer 46 using, for example, a photo exposure process. Once the vias 50 have been formed, a deep trench plating process is employed to plate an exposed interior surface of the vias 50 with metal 54 (FIG. 2). In an embodiment, the deep trench plating process plates these vias 50 with a conductive metal 54 such as, for example, copper. In another embodiment, other conductive metals or alloys may be used to suitably plate the vias 50. One or more of the plated vias 50 may be electrically coupled together during the plating process. In an embodiment, all of the vias 50 are copper-plated during the plating process. In another embodiment, only some of the vias 50 are copper plated.

Still referring to FIG. 6c, in an embodiment some of the vias 50 (e.g., the second via 56) are filled with the dielectric material 58 (FIG. 2) in order to form high volume capacitors 60 (a single capacitor is shown in FIG. 6c). In an embodiment, a stencil printing process is employed to fill some of the vias 50 with the dielectric material 56. In an embodiment, the stencil printing process is also used to generate a layer of dielectric material over the contacts 18 and upon the lamination layer 46 (FIG. 2).

As shown in FIG. 6c, the capacitor 60 is embedded within what will eventually become the bottom package 14 of the FiPoP device 10 of FIG. 1. In an embodiment, another other passive device (e.g., a resistor) may be formed in one or more of the vias 50 by filling the vias with an appropriate resistive material 62 (e.g., carbon, a ceramic, etc.) instead of with the dielectric material 58.

In an embodiment, the capacitor 60 may be horizontally adjacent to one of the vias 50 that has not been filed with dielectric material (i.e., a copper-plated via 50 functioning as an interconnection) as shown in FIG. 2. In another embodiment, however, the capacitor 60 may be horizontally adjacent to another one of the capacitors 60 formed using the above described process. Indeed, several of the capacitors 60 may be situated side-by-side or otherwise arranged depending on the requirements of the bottom package 14 or the FiPoP device 10. In an embodiment, where several of the capacitors 60 are formed in the bottom package 14 of the FiPoP device 10, each of the capacitors 60 may offer the same capacitance (e.g., $C_1$=0.2 pico Farard (pF), $C_2$=0.2 pF, $C_3=0.2$ pF, etc.). In another embodiment, each of the capacitors 60 may have different capacitances (e.g., $C_1=0.1$ pF, $C_2=0.2$ pF, $C_3=0.4$ pF, etc.). In an embodiment, several of the capacitors 60 may be electrically coupled together to form a bank of capacitors.

The capacitors 60 formed as noted above are able to reduce the resistive-capacitive (RC) delay of the FiPoP device 10 relative to when distant capacitors (e.g., capacitors not incorporated into the FiPoP device 10) are used. The capacitors 60 are also able to reduce the signal rising/falling time of the FiPoP device 10.

After the vias 50 have been filled with the dielectric material 62 to form the capacitors 60 and/or copper plated to form interconnections or other electric circuitry, a redistribution layer (RDL) process is performed to generate a desired pattern of contacts 18 and/or metallization on or in a top surface of the lamination layer 46. As shown, the redistribution layer process generates the contacts 18 used to receive the center ball grid array (BGA) 16 of the top package 12 shown in FIG. 1. In an embodiment, a passivation process may be performed to generate the passivation layer 48 on the substrate 24 and around the contacts 18.

Referring now to FIG. 6d, a carrier bonding process is performed to temporarily bond a carrier 68 to the redistribution layer 46. The carrier 68 is used to effectively move and position the entire assembly for further processing. In an embodiment, the assembly is inverted using the carrier 68 and a backside thinning process is performed to remove a portion of the substrate 24 and to expose the metal interconnections 36. Once the metal interconnections 36 have been exposed, another RDL process and an under bump metallization (UBM) process are performed to provide the UBM 26 configured to receive solder balls 32 from the ball grid array 34. The ball grid array 34 may be employed to electrically couple the FiPoP device 10 to a circuit board or another electronic device. In an embodiment, a passivation process may be performed to generate the passivation layer 28 on the substrate 24 and over the contacts 26. In addition, in an embodiment a molding process may be performed to form the molding layer 30 over the passivation layer and around a portion of the solder balls 32.

Referring now to FIG. 6e, a carrier de-bonding process is performed to remove the carrier 68. Once the carrier 68 has been removed, a singulation process is performed generate individual bottom packages 14. Finally, a known good package (KGP) process is performed to test the packages 14.

Based on the above, those skilled in the art will recognize that the FiPoP device 10 provides an innovative package on package structure with built-in integrated passives. Therefore, performance of the FiPoP device 10 is increased. In addition, operational frequency for the FiPoP device 10 is higher.

A package for a use in a package-on-package (PoP) device. The PoP device comprises a substrate, a polymer layer formed on the substrate, a first via formed in the polymer layer, and a material disposed in the first via to form a first passive device.

A package-on-package (PoP) device comprises a top package and a bottom package operably coupled to the top package. The bottom package includes a substrate supporting a polymer layer. The polymer layer includes a first via filled with a first material to form a first passive device.

A method of forming a package for a use in a package-on-package (PoP) device. The method comprises forming a polymer layer on a substrate, forming a first via in the polymer layer, and filling the first via with a material to form a passive device.

While the disclosure has been provided with reference to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A package for a use in a package-on-package (PoP) device, comprising:
    a substrate;
    a polymer layer formed on the substrate;
    a first via formed in the polymer layer, the first via having a first sidewall in the polymer layer and a second sidewall in the polymer layer, the first sidewall facing the second sidewall;
    a non-conductive material disposed in the first via to form a first passive device, an uppermost surface of the non-conductive material engaging a passivation layer, the passivation layer extending over from the first sidewall to the second sidewall of the polymer layer; and
    a first contact and a second contact, the passivation layer and the first passive device being interposed between the first contact and the second contact.

2. The PoP device of claim 1, wherein the first passive device is at least partially disposed within the first via.

3. The PoP device of claim 1, wherein the first passive device comprises first and second contacts on opposing sides of the non-conductive material disposed in the first via.

4. The PoP device of claim 1, wherein the non-conductive material is a dielectric material forming at least one of a capacitor and a resistor.

5. A package for a use in a package-on-package (PoP) device, comprising:
    a substrate;
    a polymer layer formed on the substrate;
    a first via formed in extending from a first side of the polymer layer to a second side of the polymer layer;
    a first contact on the first side of the polymer layer;
    a second contact on the second side of the polymer layer, wherein the polymer layer is interposed between first contact and the second contact; and
    a material disposed in the first via to form a first passive device electrically interposed between the first contact and the second contact, a non-conducting layer extending over and contacting an uppermost surface of the polymer layer and an uppermost surface of the material.

6. The package of claim 5, wherein the material is a dielectric material and the first passive device is a capacitor.

7. The package of claim 6, wherein the polymer layer includes a plurality of additional vias filled with the dielectric material to form a plurality of additional capacitors, the capacitor and the additional capacitors electrically coupled together.

8. The package of claim 5, wherein the material is a resistive material and the first passive device is a resistor.

9. The package of claim 5, wherein the polymer layer comprises an organic polyimide.

10. The package of claim 5, wherein the polymer layer comprises an epoxy.

11. The package of claim 5, wherein the polymer layer includes a second via filled with the material to form a second passive device.

12. The package of claim 5, wherein the polymer layer encapsulates a logic chip mounted on the substrate.

13. A package-on-package (PoP) device, comprising:
a top package; and
a bottom package operably coupled to the top package, the bottom package including a substrate supporting a polymer layer, the polymer layer including a first via filled with a first material to form a first passive device, the first material engaging a non-conducting layer extending over the polymer layer, an upper surface of the first material being coplanar with an upper surface of the polymer layer, wherein the first material is a first dielectric material and the first passive device is a first capacitor, and wherein a top surface of the first dielectric material is electrically coupled to a first contact and a bottom surface of the first dielectric material is electrically coupled to a second contact.

14. The PoP device of claim 13, wherein the polymer layer includes a second via filled with the first dielectric material to form a second capacitor.

15. The PoP device of claim 13, wherein the polymer layer includes a plurality of additional vias filled with the first dielectric material to form a plurality of additional capacitors, the additional capacitors are electrically coupled together.

16. The PoP device of claim 13, wherein the first material is a first dielectric material and the first passive device is a first capacitor, and wherein the polymer layer includes a second via filled with a second dielectric material to form a second capacitor, the first dielectric material different from the second dielectric material such that the first and second capacitors each provide a different capacitance.

17. The PoP device of claim 13, wherein the top package incorporates a memory chip.

18. The PoP device of claim 13, wherein the bottom package incorporates a logic chip encapsulated by the polymer layer.

19. The PoP device of claim 13, wherein the second contact comprises a conductive material extending along sidewalls of the first via, the conductive material being interposed between the first dielectric material and the polymer layer.

20. The PoP device of claim 19, wherein an upper surface of the conductive material is level with an upper surface of the first dielectric material.

* * * * *